United States Patent [19]
Huang et al.

[11] Patent Number: 4,833,096
[45] Date of Patent: * May 23, 1989

[54] EEPROM FABRICATION PROCESS

[75] Inventors: John Y. Huang, Fremont; Geeng-Chuan Chern, Campbell; Tsung-Ching Wu, San Jose; James Cheng Hu, Saratoga, all of Calif.

[73] Assignee: Atmel Corporation, San Jose, Calif.

[ * ] Notice: The portion of the term of this patent subsequent to May 16, 2006 has been disclaimed.

[21] Appl. No.: 145,467

[22] Filed: Jan. 19, 1988

[51] Int. Cl.[4] .............................................. H01L 29/96
[52] U.S. Cl. ........................................ 437/29; 437/30; 437/34; 437/43; 437/52; 156/644
[58] Field of Search ............... 437/43, 52, 34, 240, 437/27, 28, 29, 30, 45, 70, 195, 200; 357/23.5; 156/643, 644

[56] References Cited

U.S. PATENT DOCUMENTS

| | | | |
|---|---|---|---|
| 4,410,375 | 10/1983 | Sawada et al. | 437/52 |
| 4,451,326 | 5/1984 | Gwozdz | 156/643 |
| 4,490,900 | 1/1985 | Chin | 357/24 |
| 4,554,729 | 11/1985 | Tanimura et al. | 437/52 |
| 4,699,690 | 10/1987 | Arakawa | 156/662 |
| 4,701,776 | 10/1987 | Perlegos et al. | 357/23.5 |

FOREIGN PATENT DOCUMENTS

| | | | |
|---|---|---|---|
| 0131482 | 6/1986 | Japan | 437/43 |
| 0025458 | 2/1987 | Japan | 437/52 |
| 0088369 | 4/1987 | Japan | 437/43 |

OTHER PUBLICATIONS

Ken Yu et al., "HMOS-CMOS—A Low-Power High-Performance Technology", *IEEE Journal of Solid-State Circuits*, vol. SC-16, No. 5, Oct. 1981, pp. 454-459.

*Primary Examiner*—Olik Chaudhuri
*Attorney, Agent, or Firm*—Thomas Schneck

[57] ABSTRACT

An EEPROM fabrication process using N-well CMOS technology with a two polysilicon floating gate stack and a double layer of conductive lines providing a small reliable memory cell and high density. Channel stops and field oxide are formed by implanting boron ions, followed by a high-temperature drive-in and oxidation cycle with a 1000 Å to 2500 Å thick nitride mask covering device areas. The floating gate stack with tunneling window is formed by implanting a first species of N-type impurity, forming a first gate oxide layer, defining a window in the oxide layer over the implant, implanting a second species of N-type impurity through the window, regrowing a thin oxide layer 70 Å to 90 Å thick in a window, depositing a first polysilicon layer having a thickness of between 2500 Å and 3400 Å, selectively removing the polysilicon and gate oxide layers to form a floating gate, growing a uniformly thick second oxide layer at 1,000° to 1,050° C. over both the substrate and floating gate, depositing a second polysilicon gate layer and selectively etching away the second polysilicon gate layer to form control gates. Metal coverage in the double layer of conductive lines is improved by rounding corners of glass by means of glass flow and re-flow, corners of intermetal layers by planarization and wet/dry etcing of the via holes, and corners of the first metal by means of wet/dry etching.

18 Claims, 5 Drawing Sheets

EEPROM FABRICATION PROCESS

TECHNICAL FIELD

The present invention relates to fabrication of electrically erasable programmable read-only memory (EEPROM) devices, and in particular to fabrication processes using complementary metal-oxide-semiconductor (CMOS) technologies.

BACKGROUND ART

Read-only memory (ROM) devices are commonly fabricated by employing metal-oxide-semiconductor (MOS) devices as the memory cells in a memory cell array. Each MOS device can be turned on by applying a voltage higher than its threshold voltage to a gate. To write into ROMs, ion implantation or other techniques are employed during fabrication to alter the threshold voltage of MOS devices representing particular memory cells. A desired program is thus stored in the ROM device. However, this method does not offer enough flexibility for most applications because the ROM is programmed in the middle of the overall fabrication process, and it typically takes from one-half to one month more to complete the rest of the process. Further, changes in the ROM program require a change in the ROM code mask used in the fabrication process.

Erasable programmable ROM (EPROM) devices are ROMs, but unlike ordinary ROM and PROM devices in which information cannot be changed once written, the information stored on EPROMs can be erased and rewritten. EPROMs use floating gate avalanche injection MOS (FAMOS) devices as the memory cells. In FAMOS devices, a floating gate, completely insulated by silicon dioxide, is placed underneath an ordinary gate. The floating gate can store charge which determines the threshold voltage and therefore the ON/OFF state of the device. A FAMOS device with its floating gate neutrally charged has a low threshold voltage and can be turned "ON" easily. As a result, the memory cell stores information "1". When electrons are injected into the floating gate through a thin insulation layer from the substrate, the floating gate becomes negatively charged. Since the floating gate is surrounded by the insulation layer, the electrons, once trapped, stay inside the floating gate during normal storage and operating conditions. A FAMOS device with a negatively charged floating gate has a higher threshold voltage, and so it stays "OFF" during normal operation. As a result, the memory cell stores information "0".

EPROMs are erased by flood exposure to ultraviolet light. Ultraviolet light with high enough energy excites the electrons to escape from the floating gates and also temporarily increases the conductivity of the gate oxide. Bathing the EPROM in the correct wavelength and intensity of ultraviolet light therefore lets the stored charge leak off the floating gates, causing the gates to return to an uncharged state. After about twenty minutes, information stored in all memory cells is completely purged. New information can then be written electrically into each memory cell.

Memories can be made to erase electrically by further introducing a small window with a very thin dielectric layer between the floating gate and the substrate. Electrons can be injected into and withdrawn out of the floating gate through the small window by tunneling effects when voltages are applied across the thin dielectric layer. Memories with this capability are called electrically erasable programmable ROM (EEPROM) devices.

An object of the present invention is to provide a fabrication process for EEPROMs which reduces the physical dimensions of memory cell circuit elements for higher density integrated circuits.

Another object of the present invention is to provide a fabrication process for EEPROMs with large tolerance latitudes in the process so as to allow mass production of good quality EEPROMs with higher yield.

DISCLOSURE OF THE INVENTION

The above objects have been met with an EEPROM fabrication process using an N-well CMOS technology in which a double layer of conductive lines is formed for high performance and high density, and two species of implants in a single device element make for smaller memory cells, saving room for higher densities while maintaining good quality. The process, starting with a P-type substrate, begins by forming an N-well in the substrate, defining N-channel, P-channel and memory cell device areas, and forming N-channel stops and field oxide around the device areas. Channel stops and field oxide may be formed by thermally growing a thin oxide layer, depositing a 1000–2500 Å thick nitride layer and removing the nitride from non-device areas, implanting boron ions around the N-well and N-channel device areas, then driving in the boron and thermally growing oxide in the nondevice areas not covered by nitride.

The process continues by implanting a first species of N-type impurity in a portion of the memory cell device area, thermally growing a first oxide layer, defining a window therein over the impurity implant, implanting a second species of N-type impurity into the window hole, and regrowing a thin oxide layer in the window. Next, a 2500–3400 Å thick polycrystalline silicon ("polysilicon") layer is deposited, and removed with the first oxide layer to form the floating gate. A second oxide layer is thermally grown at a temperature of 1000°–1050° C. which ensures that this second oxide layer has a substantially uniform thickness over both the polysilicon floating gate and the substrate. After adjusting the threshold of any enhancement devices, a second gate layer, of either polysilicon or a polysilicon/silicide sandwich, is deposited and selectively removed with the second oxide layer to define gates. Sources and drains are then formed using the polysilicon gates of the particular device as a self-aligning mask.

The process concludes by defining a double layer of conductive lines in the following manner. First, a boron/phosphorus-doped silica glass covering is applied, contact holes are etched, and the glass is heated to its flow temperature to round the corners of the contact holes. A first layer of conductive lines is then defined. An insulative intermetal layer is deposited, etched back and redeposited to form a substantially planar surface. Via holes are wet/dry etched and the second layer of conductive lines is then defined.

An advantage of this process is that a thinner floating gate and a thinner interpoly oxide layer is formed, giving a denser memory and greater reliability. A thinner interpoly oxide layer has a better coupling ratio of the voltage of the floating gate to that applied to the control gate, thereby making it possible to use smaller memory cells for denser circuits. Another advantage is that the two species of impurities forming the memory cell implants allows smaller cells to be formed without current flow across any adjacent devices or field oxide during floating gate charging or discharging (programming or erasing). These smaller cells together with a double layer of conductive lines mean higher densities without reduced reliability.

BEST MODE FOR CARRYING OUT THE INVENTION

Figure 1:
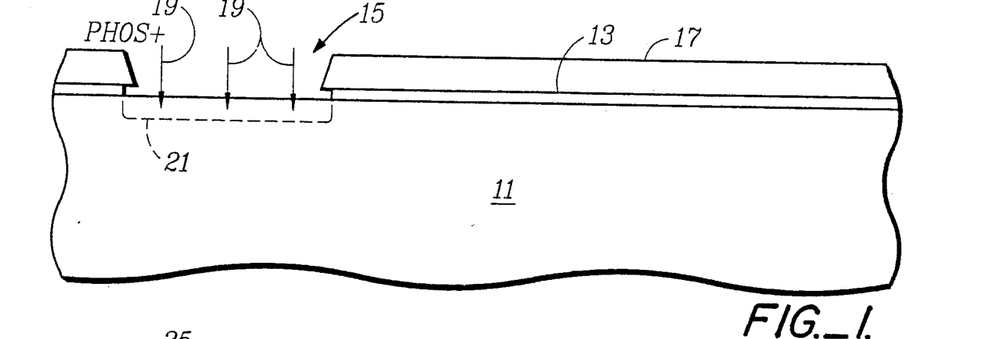
FIGS. 1–18 are side sectional views of a portion of a wafer showing the process steps of the present invention for forming an N-channel device, a P-channel device and a memory cell in an EEPROM.

With reference to FIG. 1, the starting material is a P-type (100)-oriented monocrystalline silicon substrate 11 doped to a level sufficient to provide a resistivity in the range of 5–50 ohm-cm. To reduce power dissipation of circuits, a CMOS process with N-channel memory cells is employed in this invention. After extensive cleaning steps, a silicon dioxide film 13 is thermally grown to a thickness of 2000–8000 Å. The oxidation temperature of this process is about 850°–1000° C. in a steam ($H_2/O_2$) atmosphere. This oxide layer 13 is used to define an N-well area 15 with an N-well photoresist mask 17. Oxide layer 13, through regular photolithographic techniques, is etched off in N-well area 15 with a buffer oxide etchant to form a mask for the subsequent phosphorus ion implantation, indicated by arrows 19 and implant boundary 21. The implant dose level is $3-6\times10^{12}/cm^2$ within the implant energy range of 50–300 keV.

Figure 2:
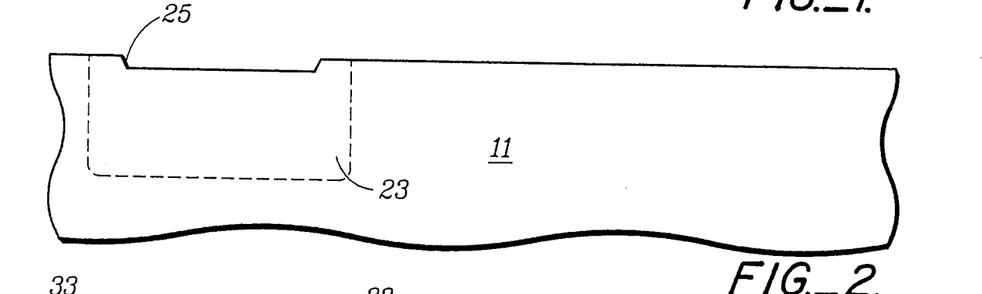

After the ion implantation step, the resist 17 is stripped and the wafer substrate 11 is subject to a high temperature drive-in treatment at 1100°–1200° C. for 8–12 hours. This drive-in forms an N-well region 23, seen in FIG. 2, with a depth of approximately 3–4 $\mu$m and with a phosphorus surface concentration of about $0.7-1.9\times10^{16}/cm^3$. During or after N-well drive-in, a silicon dioxide film of 3000–7000 Å thickness is thermally grown at 850°–1000° C. and etched to dewet to generate a silicon step 25 for alignment in the subsequent photolithographic procedures. The remaining oxide film 13 is then removed with a buffered oxide etchant (BOE), and the substrate 11 is subjected to extensive cleaning. The condition shown in FIG. 2 is the result.

Figure 3:
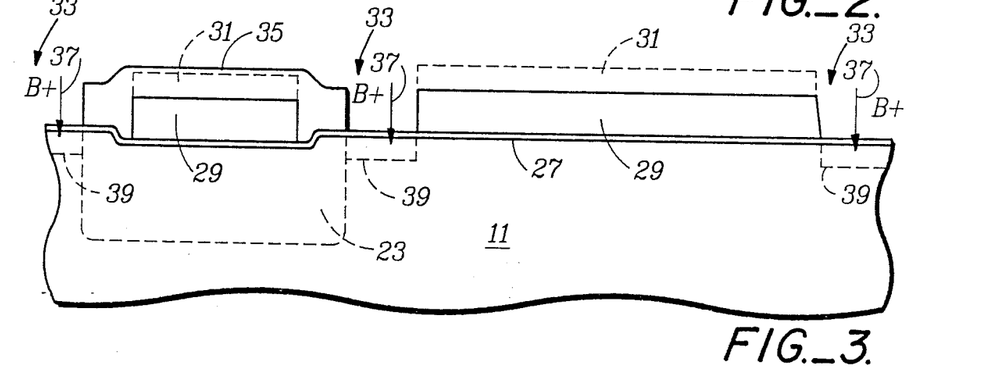

With reference to FIG. 3, the substrate 11 is then subjected to an $O_2$/HCl ambient at 900°–1000° C. to thermally grow a silicon dioxide layer 27 of 250–1000 Å thickness. On top of this oxide 27, a silicon nitride film 29 of 1000–2500 Å thickness is deposited by a low pressure chemical vapor deposition (LPCVD) method. Then, through a photolithographic step using a photoresist mask 31, this silicon nitride layer 29 is etched to define active regions. The etching is done by a plasma chemistry technique using $SF_6$ or $CF_4/O_2$ as the etchant. The silicon dioxide layer 27, grown prior to the silicon nitride deposition, assures that wafer substrate 11 is free from possible point defects or line defects, such as dislocations and subgrain boundaries, induced by the large built-in stresses ($>2\times10^{19}$ dyn/$cm^2$) of silicon nitride films. The thickness ratio of silicon nitride to silicon dioxide should be in the range from 1:1 to 7:1 to minimize the stress.

After removal of resist 31 and cleaning, another photolithographic step is employed in which field stop implant regions 33 are defined by a photomask 35. Photomask 35 is used principally to cover the N-well region 23 prior to N-channel stop formation. The channel stop is formed by implanting boron ions into the substrate 11 followed by a field oxidation cycle. Field boron implantation is indicated in FIG. 3 by arrows 37 and implant boundaries 39. The implant dose is about $1-4\times10^{13}/cm^2$, and an implantation energy within the approximate range of 25–50 keV is used. The reason for using a low voltage for this implantation is to prevent boron ions from penetrating through the silicon nitride layer 29 then into the substrate 11. Nitride layer 29 is generally thicker than that used in the prior art. Resist layer 35 is stripped after implantation.

Figure 4:
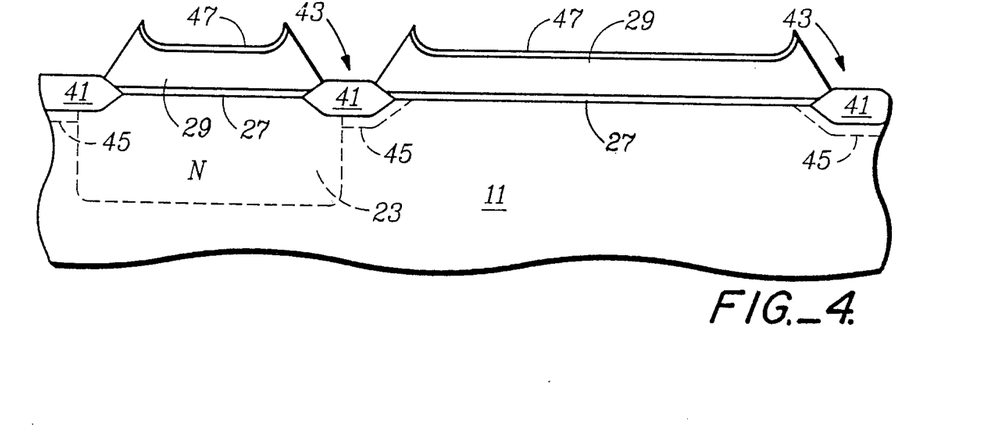

Following boron implantation, a field oxidation cycle is performed. As a result of this cycle, a 0.9–1.7 $\mu$m thick field oxide layer 41, seen in FIG. 4, is grown in the isolation areas 43 using the patterned nitride layer 29, as an oxidation mask. It is desirable that the field oxide 41 and channel stop regions 45, also seen in FIG. 4, be formed at the same time. Therefore, the field oxidation cycle includes both a high temperature (1000°–1175° C.) boron drive-in step in an $N_2$ ambient and a lower temperature (925°–975° C.) oxidation step in a steam ($H_2/O_2$) ambient. The drive-in prior to oxidation is necessary to prevent boron in stop regions 45 from being leached out in the subsequent oxidation cycles.

Figure 5:
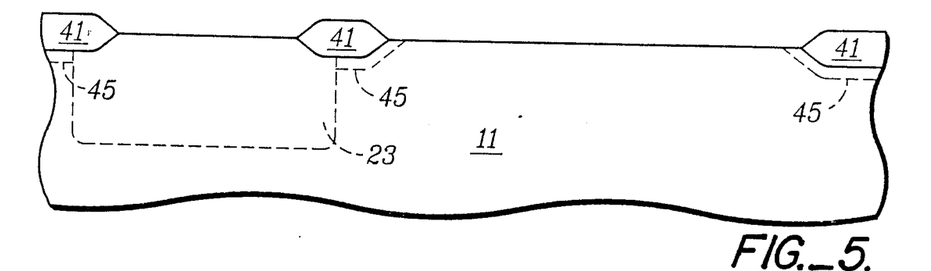

A thin silicon dioxide layer 47 is formed on the top of silicon nitride layer 29 during the field oxidation process, the top surface of silicon nitride layer 29 being converted to silicon dioxide due to the long hours process in the steam environment. The thickness of this silicon dioxide layer 47 is about 1–4% of the thickness of field oxide 41. Thus top oxide layer 47 needs to be removed before the silicon nitride strip. About 250–800 Å of silicon dioxide is etched off using BOE solution followed by stripping the silicon nitride layer 29 in phosphoric acid at an etch rate of 60–100 Å per minute. Lastly, the 250–1000 Å thick bottom oxide layer 27 that was under the nitride layer 29 is removed, followed by extensive wafer cleaning. The condition shown in FIG. 5 is the result.

Figure 6:
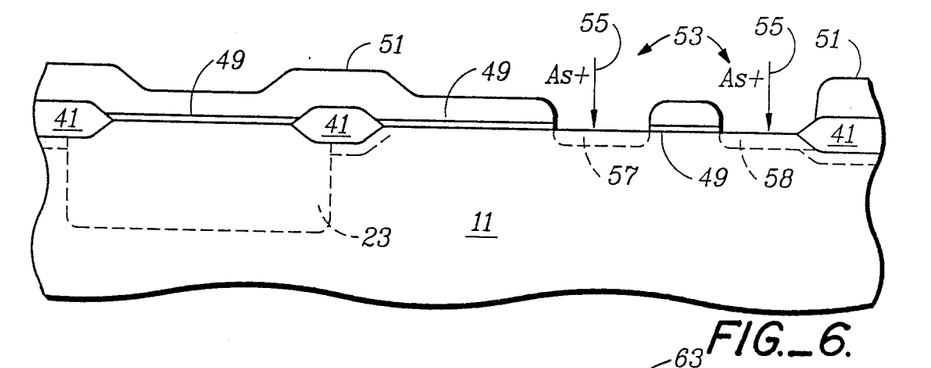

With reference to FIG. 6, the substrate 11 is subjected to a temperature of 900°–1000° C. in an $O_2$ ambient to form a masking oxide layer 49 of 150–250 Å thickness. A photoresist mask 51 is used to define buried N+ regions 53, and the oxide 49 over these defined regions 53 is etched away. The buried N+ regions 53 are then formed by implanting As, as indicated by arrows 55 and implant boundaries 57 and 58. The implant dose is $0.6-2.0\times10^{14}/cm^2$. Following the implantation and resist removal, a buffered oxide etch without wash, or "oxide dip-out", is used to strip off the oxide layer 49 to bare silicon 11.

Figure 7:
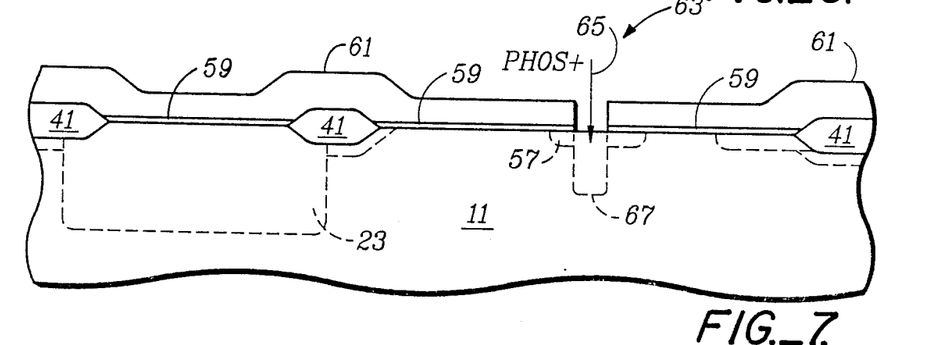

With reference to FIG. 7, the first gate oxidation 59 is grown by exposing the substrate 11 to an alternating $O_2$/HCl and $O_2/N_2$ atmosphere at 1000°–1100° C. The thickness of this layer 59 is 250–750 Å, and preferably about 400 Å. The first gate oxide 59 will be used in a memory cell. Standard photolithographic procedures, using a photoresist mask 61 and buffered oxide etchant, are used to open a small window 63 in oxide layer 59 over buried N+ region 57. Phosphorus ions are implanted through windows 63, as indicated by arrow 65 and implant boundary 67, with a dose level of $5.0-9.0\times10^{13}/cm^2$. The resist is then removed, and the substrate is cleaned very carefully. An oxidation cycle at 800°–950° C. in an $O_2/N_2$/HCl ambient is subsequently applied to form a thin silicon dioxide layer 69, seen in FIG. 8, of 70-90 Å thickness in window 63. This is followed by a heat treatment at 1000°-1050° C. in an $N_2$ atmosphere to strengthen the oxide 59 and 69.

Figure 8:
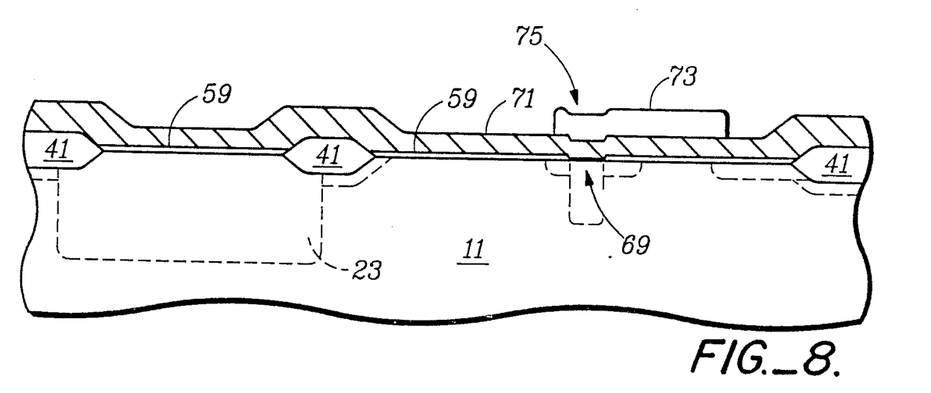

In FIG. 8, a low pressure chemical vapor deposition (LPCVD) polycrystalline silicon layer 71 of 2500-3400 Å thickness, and preferably less than 3200 Å thick, is formed over the oxide 59 and 69. The major gas used in this deposition step is $SiH_4$ (Silane), and the deposition temperature is 600°-700° C. Polysilicon layer 71 is thinner than the approximately 4000 Å thick polysilicon layers found in the prior art. Polysilicon layer 71 is doped to achieve the desired sheet resistance. A $P_2O_5$ film is grown over layer 71 by employing $POCl_3$ and $O_2/N_2$ at a temperature of 900°-950° C. $PH_3$ (phosphine) may also be used. A sheet resistance of 20-40 ohm/square is achieved through this doping step. A buffered oxide etch is applied to remove the phosphorus glass that forms over the polysilicon during doping.

Figure 9:
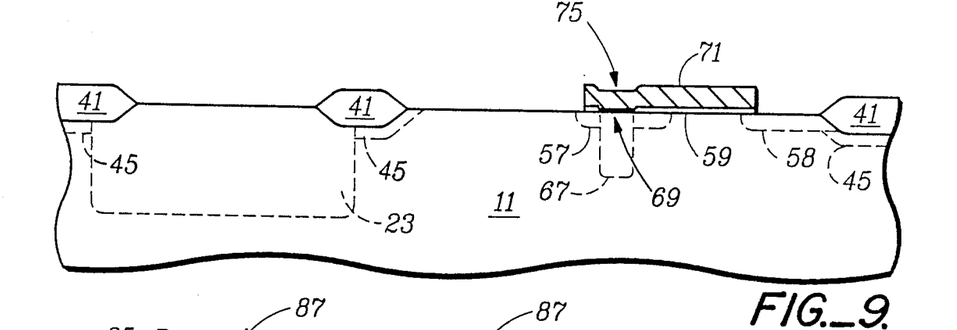

A photoresist layer 73 is next placed on the polysilicon film 71, and using regular photolithographic techniques, a floating gate area 75 for a memory cell is defined. Polysilicon layer 71 is then etched off the non-floating gate areas not covered by resist 73 by using a plasma etch. A typical plasma chemistry chosen for this step is $CCl_4/SF_6$, $Cl_2/O_2$ or $SF_6/O_2$. After etching, resist 73 is stripped, then oxide layer 59 is removed with an oxide dipout step from all wafer areas not covered by the remaining polysilicon 71 in floating gate area 75, which serves as a mask. The wafer is then subject to extensive cleaning steps. The condition shown in FIG. 9 is the result.

Figure 10:
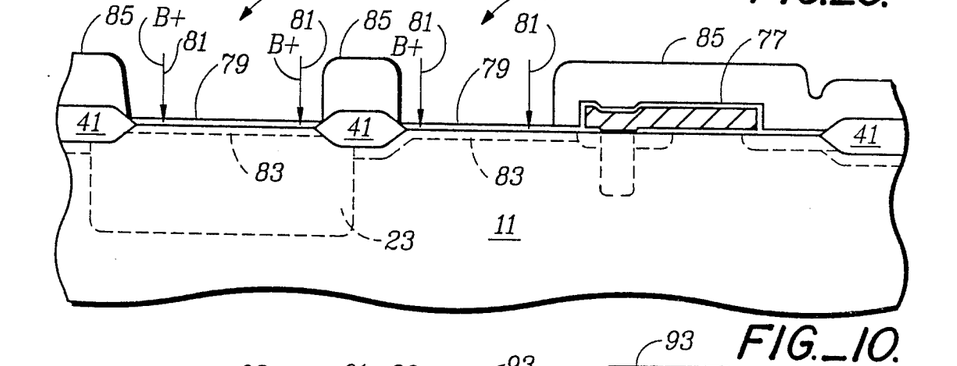

With reference to FIG. 10, the wafer is then subjected to a high temperature oxidation cycle to form the interpoly dielectric layer 77 as well as the gate oxide 79 for peripheral devices (both P-channel and N-channel). This second gate oxide 77 and 79 is grown in $O_2/N_2$ atmosphere at a temperature of 1000°-1050° C. The thickness of these silicon dioxide layers 77 and 79 is between 320 Å and 360 Å. The reason for using high temperatures is to achieve better control of the relative growth rate of silicon dioxide over the polysilicon gate and the monocrystalline silicon substrate. The conventional dry oxidation process, which usually uses lower temperatures of 900°-1000° C., would grow much more oxide on polysilicon than over the substrate. The $O_2/N_2$ mixture is used to reduce the oxidation rate at these high temperatures to a reasonable and controllable rate.

To adjust the threshold voltage of enhancement devices, a boron ion implantation of dose level $7-9 \times 10^{11}/cm^2$ at 40-80 keV is employed, represented by arrows 81 and implant boundaries 83 in FIG. 10, for both P-channel and N-channel devices. Ordinary photolithographic techniques may be employed, using a photomask 85, to define areas 87 for threshold adjustment. Alternatively, implantation may take place without mask 85, mask 85 being optional. If mask 85 is used, it is subsequently stripped after implantation, and the wafer is cleaned.

Figure 11:
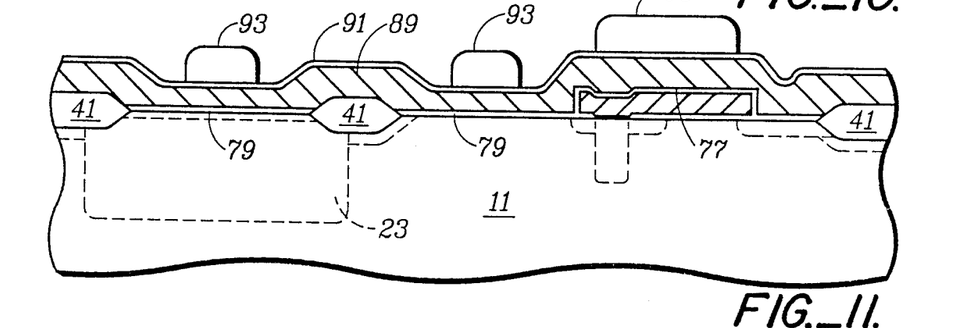

With reference to FIG. 11, a second polysilicon film 89 is applied over interpoly dielectric layer 77 and second gate oxide 79. The low pressure chemical vapor deposition (LPCVD) process used is similar to the deposition of the first polysilicon layer 71 in FIG. 8 used to form floating gate 75. The thickness of this second polysilicon layer 89 is 4000-4900 Å thick, standard for the industry. Polysilicon film 89 is then doped with phosphorus to achieve a 15-30 ohm/square sheet resistance. The doping procedure is similar to that for the first polysilicon layer 71, described above, except that a slightly higher temperature of 925°-975° C. is used. BOE is used to remove the phosphorus glass ($P_2O_5$) which is formed during the $POCl_3$ doping step. A silicide/polysilicon sandwich may replace the second polysilicon 89 in some high speed devices, the sandwich reducing the interconnect resistance and thereby improving device speed.

Figure 12:
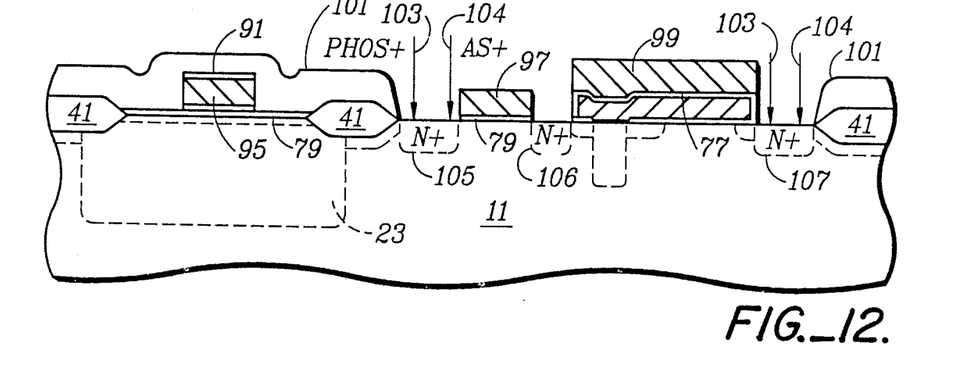

A photoresist layer 93 is used as a mask to define the shape of the second polysilicon layer 89. To promote adhesion of the photoresist 93 to the wafer surface, a layer 91 of silicon dioxide may be grown by the surface oxidation of second polysilicon layer 89. Oxide layer 91 is optional. With photomask 93 in place, oxide layer 91, if any, and second polysilicon layer 89 are etched. Highly anisotropic etching is preferred. The etching chemistry chosen for this step, typically $CCl_4/SF_6$, is similar to the first polysilicon etching in FIG. 8 above. As a result of etching, polysilicon gates 95 and 97 for peripheral devices, as well as second polysilicon gates 99 for memory cells, seen in FIG. 12, are defined. Mask 93 is subsequently stripped.

Figure 13:
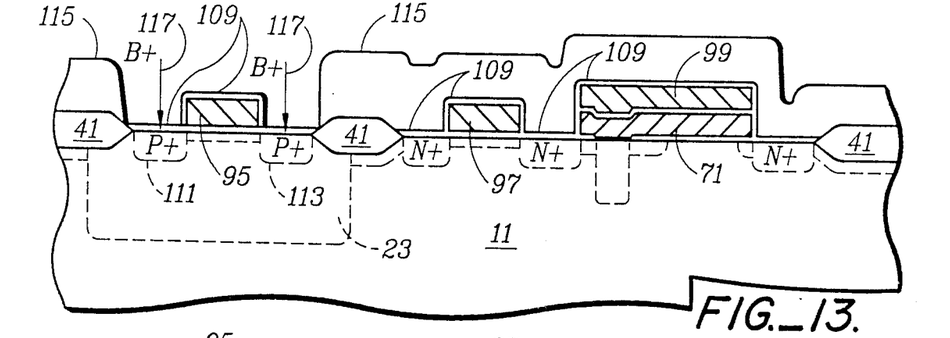

With reference to FIG. 12, to define N-channel source and drain areas, a photomask 101 is placed on the wafer. The wafer is then subjected to a moderate-dose phosphorus ion implantation, indicated by arrows 103, followed by a high-dose arsenic ion implantation, indicated by arrows 104 and N+ implant boundaries 105-107. Phosphorus is implanted to a dose of $2.0-7.0 \times 10^{13}/cm^2$ and is used to create a graded p-n junction. Arsenic is implanted to a dose of $1-8 \times 10^{15}/cm^2$ at an implantation energy of about 70-100 keV. The N+ implant depth is about 0.4 μm after the end of the process. Note that gate oxide layer 79 is removed from the exposed areas above the implantation sites prior to implantation. After the N-channel source and drain areas 105-107 have been implanted, the resist 101 is stripped and a layer 109, seen in FIG. 13, is regrown over the areas of exposed substrate. This refill oxidation is formed thermally at 900°-975° C. in an $O_2$ atmosphere. Oxide layer 19 fills up the cavities between polysilicon layers 71 and 99 and between polysilicon 71, 95 and 97 and substrate 11. It also prevents polysilicon edges from low voltage breakdown.

Figure 14:
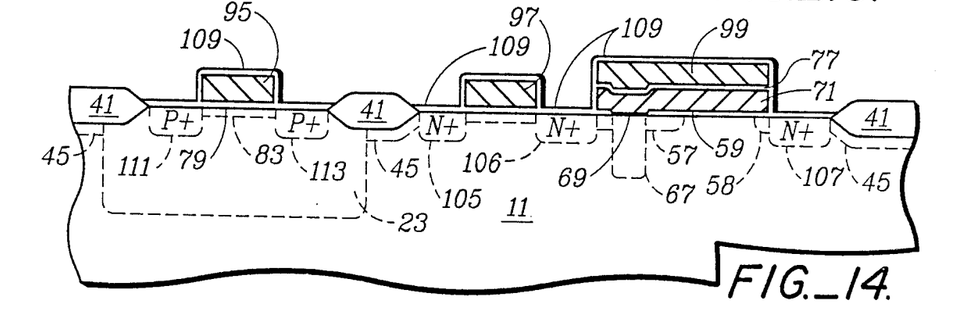

With reference to FIG. 13, P-channel source and drain areas 111 and 113 are defined by another photomask 115. Boron ion implantation is then carried out, as indicated by arrows 117 and implant boundaries 111 and 113, to create the source and drain. The dose is in the range from $1-3 \times 10^{15}/cm^2$, while the implantation energy is about 40-80 keV. The resulting source and drain junctions 111 and 113 are about 0.6 μm deep after the end of the process. Implantation is followed by a resist strip, resulting in the condition shown in FIG. 14.

Figure 15:
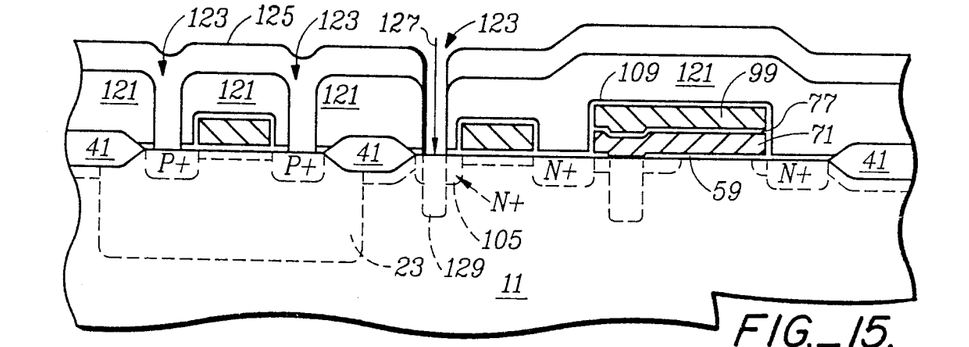

With reference to FIG. 15, a boron/phosphorus-doped silica glass (BPSG) layer 121 is next deposited on the wafer using a low pressure chemical vapor deposition technique. The concentration of boron in this glass is 2.0-4.0 wt. %, while the concentration of phosphorus is about 4-8 wt. %. An advantage of using BPSG over conventional PSG is that the glass flow temperature is lower for the BPSG than the PSG. A high temperature anneal step at 900°-1000° C. in alternating $H_2/O_2$ and $N_2$ ambients is employed to flow the BPSG. The thickness of BPSG layer 121 must be sufficient to cover the very high floating gate stack (Gates 71 and 99 together with oxide layers 59, 77 and 109 have a total thickness of about 9000 Å.) to avoid breakdown at 20-25 Volts between gates 71 and 99 and subsequent metal contacts. The 1.0 to 1.5 μm thick glass 121 is accordingly about twice as thick as that found over logic gates, which need only withstand shorting to 10 Volts.

A photomask, not shown, is placed over glass layer 121 to define contact holes 123 where metal is to make contact with the substrate 11 or the polysilicon gates 95, 97 and 99. Plasma etching or reactive ion etching can be used to form holes 123. $CHF_3/O_2$ chemistry is typically used for this purpose. Oxygen is added to avoid polymer formation, which may block further etching of the contact holes 123. After the contact hole photomask is stripped, another photomask 125 is applied to cover the P-channel contacts. The substrate 11 is then subjected to phosphorus ion implantation, indicated by arrows 127, to create N+ phosphorus plugs, indicated by implant boundaries 129, for the N-channel contacts. The dose of this implant is $2-8 \times 10^{15}/cm^2$ at an implantation energy of 50-150 keV. After implantation, resist 125 is removed.

At this point, the backside of the wafer is etched to remove the silicon dioxide and polysilicon layers which have accumulated from previous growth and deposition steps. A thick coat of negative resist, 2.0-5.0 μm thick, is applied to protect the front side of the wafer. The backside of the wafer is then subjected to buffered oxide and plasma polysilicon etching clear to the original substrate. After backside etching is completed, the protective resist coat is stripped, and the wafer is put through a regular cleaning procedure.

To improve the metal step coverage, the wafer is subjected to a heat treatment at approximately 900°-1000° C. for producing reflow of the etched BPSG layer 121. Alternating $O_2/N_2$ ambients are used for this purpose. The reflow smoothes out sharp corners at the top of holes 123. The heat also activates the plug implant doping 129. Prior to metal deposition, the substrate is subjected to a very light buffered oxide etch, so as to etch off the 300-2000 Å of silicon dioxide which is grown during the reflow process.

Figure 16:
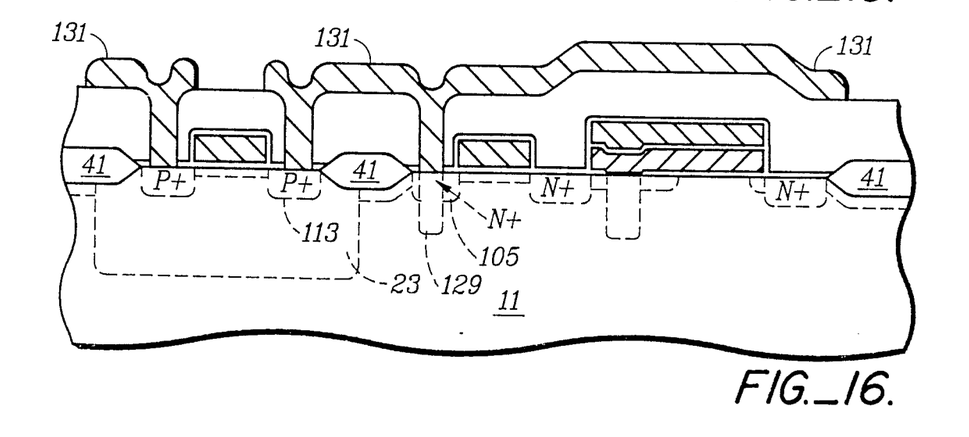

With reference to FIG. 16, an aluminum/silicon layer 131 is deposited on top of the wafer. The metal film 131 is about 0.6-1.2 μm thick and is 0.5-2.0% silicon. Sputtering deposition is used, and the wafer is heated up to 200°-350° C. before sputtering deposition. Employing standard photolithographic techniques, metal connection lines are defined with a photomask, not shown, and then etched using a plasma etching method in a RIE mode. Wet and dry etching gives the connection lines curved edges for better step coverage of the second metal layer. The typical chemistry for the Al/Si etch is $Cl_2$, $BCl_3$ and $O_2$. An additional $CF_4$ plasma post-treatment will be helpful to avoid metal corrosion. Resist is then removed. For example, in FIG. 17 the source or drain 113 of a P-channel device is connected by metal connection lines 131 to a source or drain of an adjacent N-channel device defined by implant 105 and plug 129.

Figure 17:
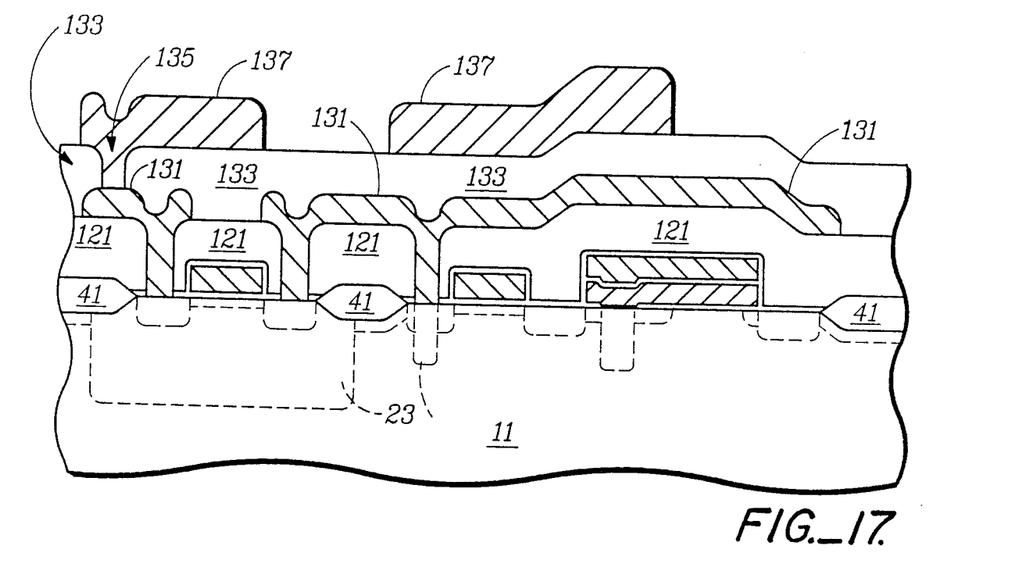

With reference to FIG. 17, for high speed devices, a double metal process is applied. An intermetal layer 133 of oxynitride, phosphorus-doped silica glass (PSG) or both is deposited over first metal layer 131. The thickness of this layer is about 6000-14000 Å. A planarization process is used to improve coverage in the subsequent second metal step. Etchback and redeposit is the technology used for this purpose. A 60-95% etchback plus redeposit to the desired thickness usually can achieve a reasonably flat wafer surface. Intermetal connect via holes 135 are defined by a photomask, followed by a wet and dry plasma/reactive ion etch and resist strip.

After a pre-deposition back sputter etching of the wafer, a second metal layer 137 is sputtering deposited over glass layer 133. The second metal lines are defined in the same manner as the first metal lines, i.e. by means of a photomask and plasma RIE-mode etching. In order to stabilize the surface stakes between metal 131 and 137 and substrate 11, the wafer is annealed at approximately 380°-450° C. in an $N_2/H_2$ ambient. This process, known as the "alloy process", also serves to alloy the deposited aluminum to the silicon substrate for a good ohmic contact.

Figure 18:
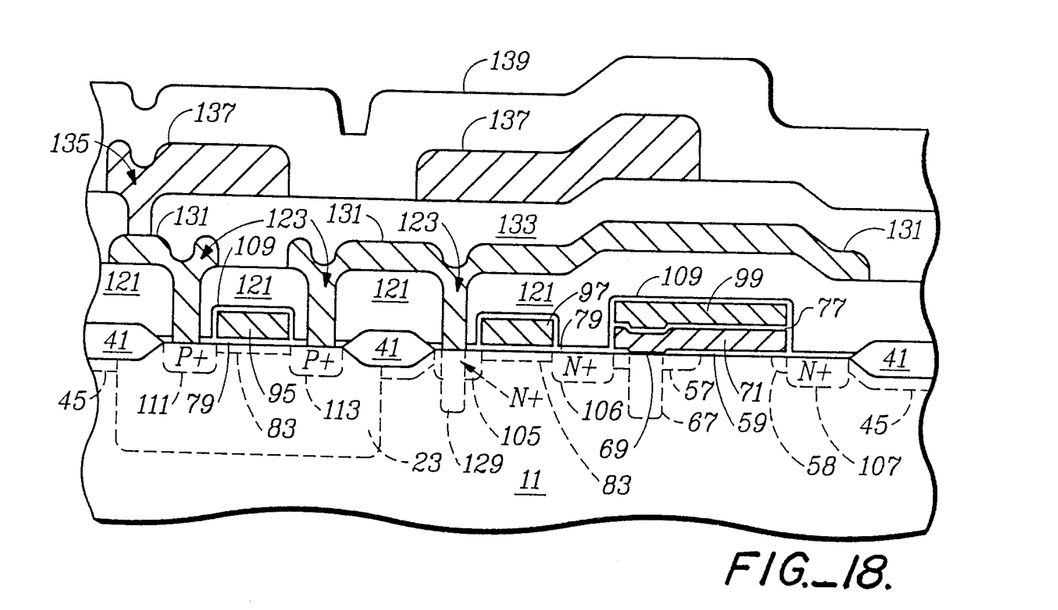

With reference to FIG. 18, a passivation layer 139 is deposited over the second metal layer 137, or for single metal layer devices, over the metal layer 131. Passivation layer 139 comprises a sandwich of oxynitride and phosphorus-doped silica glass (PSG). To form passivation layer 139, PSG is deposited on the wafer by applying an atmospheric pressure chemical vapor deposition technique in silane and oxygen phosphine gases. The concentration of phosphorus in the glass is about 2-4 wt. % and the thickness of this PSG layer is about 1.0-1.3 μm. The oxynitride is deposited over the PSG by using a plasma enhanced chemical vapor technique. The thickness of oxynitride is about 3000-10000 Å with refractive index approximately 1.70-1.74. The resulting passivation layer 139 protects the fabricated integrated circuit on the wafer from moisture and contaminations.

Standard photolithographic techniques are employed to define pad openings, not shown, for probing as well as wire bonding. The oxynitride is plasma etched, while the PSG is etched with a wet oxide etching solution to open these pad areas. After removing the pad mask, a thick negative photoresist coating, 4-10 μm thick, is applied to cover the front side of the substrate. The substrate is then subjected to a backgrinding operation. The final thickness of the wafer is about 300-550 μm. Following resist removal procedures, the wafer is subjected to a light etch in buffered oxide etchant 0.8-1.2% in concentration until the backside is dewet to prepare the backside of the substrate for chrome-gold or gold deposition. After chrome-gold deposition, the device on the substrate is exposed to ultraviolet light to erase or eliminate any possible charging up during the process, and given an electrical test in a probe assembly. The final device is seen in FIG. 18.

We claim:

1. An EEPROM fabrication process comprising,
   forming an N-well in a P-type wafer substrate,
   forming N-channel and P-channel MOS devices on said substrate, said MOS devices having sources, drains and gates associated therewith, said P-channel MOS device being formed in said N-well,
   forming an electrically-erasable and programmable memory cell on said substrate, said memory cell being formed with a floating gate disposed over an oxide layer including a thin-oxide window region,
   depositing a boron and phosphorus doped silica glass layer covering said MOS devices and said memory cell, forming contact holes in said covering, and heating said glass layer covering to a flow temperature,
   forming a first layer of conductive lines on said glass layer, said lines connecting to selected sources, drains and gates of said MOS devices and of said memory cell via said contact holes, forming an insulative intermetal layer over said first layer of conductive lines, said intermetal layer being formed with a substantially planar surface and with via holes therein having rounded corners, and forming a second layer of conductive lines on said intermetal layer, said lines of said second layer connecting to selected lines of said first layer through said via holes.

2. The process of claim 1 wherein forming said memory cell comprises, implanting a first species of N-type impurity in said substrate, thermally growing a first oxide layer on said substrate and defining a window therein over a portion of said first impurity implant, implanting a second species of N-type impurity in said substrate through said window, said first and second species of N-type impurity being located in regions of said substrate which overlap under said window, regrowing a thin oxide layer in said window to a thickness of 70 Å to 90 Å, depositing a first polysilicon layer over said first oxide layer and said thin oxide layer, said first polysilicon layer having a thickness of 2500–3400 Å, selectively removing said first polysilicon layer and said first oxide layer to form a floating gate disposed over said first oxide layer including the thin-oxide window region, thermally growing a second oxide layer over said floating gate and said wafer substrate, said second oxide layer being grown at a temperature of 1000° C. to 1050° C., depositing a second gate layer over said second oxide layer, and selectively removing said second gate layer for defining N-channel device, P-channel device and memory cell device gates.

3. The process of claim 2 wherein said second gate layer is formed from polysilicon.

4. The process of claim 2 wherein said second gate layer is formed of a polysilicon and silicide sandwich.

5. The process of claim 1 wherein forming contact holes in said glass layer comprises selectively etching said glass layer over said selected sources, drains and gates, said heating of said wafer after said contact etch having the effect of smoothing out corners at the top of said contact holes.

6. The process of claim 1 wherein said boron and phosphorus doped silica glass has a concentration of 2.0 wt. % to 4.0 wt. % boron and 4 wt. % to 8 wt. % phosphorus, said glass having a flow temperature of approximately 900° C. to 1000° C.

7. The process of claim 1 wherein forming said insulative intermetal layer comprises, depositing a layer of insulative material on said first layer of conductive lines, etching back 60% to 90% of said insulative material, re-depositing said insulative material to a thickness in a range from 6000 Å to 14000 Å, said redeposited material forming a substantially planar surface, and selectively etching vias through said planar surface over said selected first conductive lines using a wet and dry etch.

8. An EEPROM fabrication process comprising, forming an N-well in a P-type substrate, defining N-channel and P-channel MOS devices on said substrate, said MOS devices having sources, drains and gates associated therewith, said P-channel MOS device being formed in said N-well, forming an electrically-erasable and programmable memory cell on said substrate, said memory cell being formed with a floating gate disposed over an oxide layer, said oxide layer including a thin-oxide window region under said floating gate, wherein two species of N-type impurities are implanted in said substrate in overlapping regions under said floating gate, the regions overlapping under said window region for tunneling, forming a glass layer over said devices on said substrate and forming contact holes with rounded corners therein, and forming a first layer of conductive lines on said glass layer, said lines connecting to selected sources, drains and gates of said devices via said contact holes.

9. The process of claim 8 further comprising forming an insulative intermetal layer over said first layer of conductive lines with via holes therein, and forming a second layer of conductive lines on said intermetal layer, said lines of said second layer connecting to selected lines of said first layer through said via holes.

10. The process of claim 8 wherein said two species of N-type impurities implanted under said window region are phosphorus and arsenic.

11. The process of claim 8 wherein said oxide layer has a thickness in a range from 250 Å to 750 Å and said thin-oxide window region has a thickness in a range from 70 Å to 90 Å.

12. An EEPROM fabrication process comprising, forming an N-well in a P-type substrate, defining N-channel, P-channel and memory cell device areas in said substrate, said P-channel device areas being defined in said N-well, forming N-channel stops and field oxide around said device areas, implanting a first species of N-type impurity in a portion of each said memory cell device area in said substrate, thermally growing a first oxide layer on said wafer substrate and defining a window therein over a portion of said first N-type impurity implant, implanting a second species of N-type impurity in said substrate through said window, said first and second species of N-type impurity being located in regions of said substrate which overlap under said window, regrowing a thin oxide layer in said window to a thickness of 70 Å to 90 Å, depositing a first polysilicon layer over said first oxide layer and said thin oxide layer, said first polysilicon layer having a thickness of 2500 Å to 3400 Å, selectively removing said first polysilicon layer and said first oxide layer from all areas of said wafer substrate except said memory cell device areas so as to form a floating gate disposed over said first oxide layer including the thin-oxide window region, thermally growing a second oxide layer over said floating gate and said wafer substrate, said second oxide layer being grown at a temperature in the range from 1000° C. to 1050° C. to a thickness in a range from 320 Å to 360 Å, introducing a threshold adjusting dopant into selected N-channel and P-channel device areas, depositing a second gate layer over said second oxide layer, selectively removing said second gate layer and said second oxide layer for defining N-channel device, P-channel device and memory cell device gates, forming sources and drains for said devices, depositing a glass layer over said devices on said wafer substrate and forming contact holes with rounded corners therein, and forming a first layer of conductive lines on said glass layer, said lines connecting to selected sources, drains and gates of said devices via said contact holes.

13. The process of claim 12 further comprising forming an insulative intermetal layer over said first layer of conductive lines, said intermetal layer being formed with via holes therein having rounded corners, and forming a second layer of conductive lines on said intermetal layer, said lines of said second layer connecting to selected lines of said first layer through said via holes.

14. The process of claim 13 wherein
(a) depositing said glass layer and forming contact holes therein comprises depositing said glass layer, heating said glass layer to a flow temperature, etching said glass with a wet and dry process to form said contact holes, again heating said glass layer to a reflow temperature,
(b) forming said first layer of conductive lines comprises depositing a conductive layer on said glass layer, etching said conductive layer to form said conductive lines, and wet and dry etching said conductive lines for curving the edges of said lines,
(c) forming said intermetal layer comprises depositing an insulative material layer over said conductive lines, etching back said insulative material layer by 60-95%, and redepositing said insulative material to a thickness in a range from 6000 Å to 14000 Å, and
(d) forming said via holes in said intermetal layer comprises wet and dry etching said intermetal layer to form said via holes.

15. The process of claim 12 wherein said second gate layer is formed of polysilicon.

16. The process of claim 12 wherein said second gate layer is formed of a polysilicon and silicide sandwich for high speed operation.

17. The process of claim 12 wherein forming said N-channel stops and field oxide comprises, thermally growing a thin silicon dioxide layer with a thickness in the range from 250 Å to 100 Å on said substrate depositing a silicon nitride layer with a thickness in the range from 1000 Å to 2500 Å on said silicon dioxide layer, thickness ratio of silicon nitride to silicon dioxide being in the range from 1:1 to 7:1, removing said silicon nitride from all areas of said wafer except said device areas, implanting boron ions into said substrate around N-channel device areas and around said N-well, the implantation energy being in the range form 25 keV to 50 keV, and driving in said boron ions and thermally growing oxide in all areas except said device areas covered by said nitride, and removing said nitride layer and said thin silicon dioxide layer.

18. The process of claim 12 wherein said first gate oxide layer has a thickness in a range from 250 Å to 75 Å.

* * * * *

UNITED STATES PATENT AND TRADEMARK OFFICE
CERTIFICATE OF CORRECTION

PATENT NO. : 4,833,096

DATED : May 23, 1989

INVENTOR(S) : John Y. Huang et al.

It is certified that error appears in the above-identified patent and that said Letters Patent is hereby corrected as shown below: On the title page:

Abstract, line 14, "a window" should read -- the window --.

Column 6, line 42, "Oxide layer 19" should read -- Oxide layer 109 --.

Claim 2, column 9, lines 26-27, "2500-3400 Å" should read -- 2500 Å to 3400 Å --.

Claim 7, column 9, line 60, "60% to 90% should read -- 60% to 95% --.

Claim 17, column 12, line 16, "100 Å" should read -- 1000 Å --.

Claim 17, column 12, line 19, "thickness ratio" should read -- the thickness ratio --.

Claim 17, column 12, line 26, "form" should read -- from --.

Claim 18, column 12, line 34, "75" should read -- 750 --.

Signed and Sealed this

Twenty-fourth Day of April, 1990

*Attest:*

HARRY F. MANBECK, JR.

*Attesting Officer*        *Commissioner of Patents and Trademarks*